United States Patent [19]

Hipwood

[11] Patent Number: 4,633,279
[45] Date of Patent: Dec. 30, 1986

[54] SEMICONDUCTOR DEVICES

[76] Inventor: Leslie G. Hipwood, 70 Locket Road, Wealdstone, Harrow, Middlesex, England, HA3 7NE

[21] Appl. No.: 678,664

[22] Filed: Dec. 6, 1984

[30] Foreign Application Priority Data

Dec. 12, 1983 [GB] United Kingdom ................ 8333130

[51] Int. Cl.⁴ .......................................... H01L 29/161
[52] U.S. Cl. ........................................ 357/16; 357/58; 357/4; 357/88; 357/90
[58] Field of Search ....................... 357/88, 90, 16, 58, 357/4

[56] References Cited

U.S. PATENT DOCUMENTS

| | | | |
|---|---|---|---|
| 4,032,961 | 6/1977 | Baliga | 357/88 |
| 4,107,721 | 8/1978 | Miller | 357/78 |
| 4,352,117 | 9/1982 | Cuomo | 357/16 |
| 4,516,146 | 5/1985 | Shannon | 357/90 |

Primary Examiner—Martin H. Edlow

[57] ABSTRACT

A semiconductor switching device, which makes use of a hot electron emitter to give high speed operation, comprising a body (3) of intrinsic semiconductor material carried on a substrate (1) of n-type conductivity and a hot electron emitter (11, 13) which, when a bias potential is applied between the emitter and substrate, injects hot electrons into the body with a sufficient energy to generate electron-hole pairs in the body by collision of injected electrons with valence electrons. The device further includes a p-type conductivity region (7) contiguous with the body (3) to which, when appropriately biassed with respect to the substrate, the generated holes diffuse, the generated electrons diffusing to the substrate (1).

7 Claims, 3 Drawing Figures

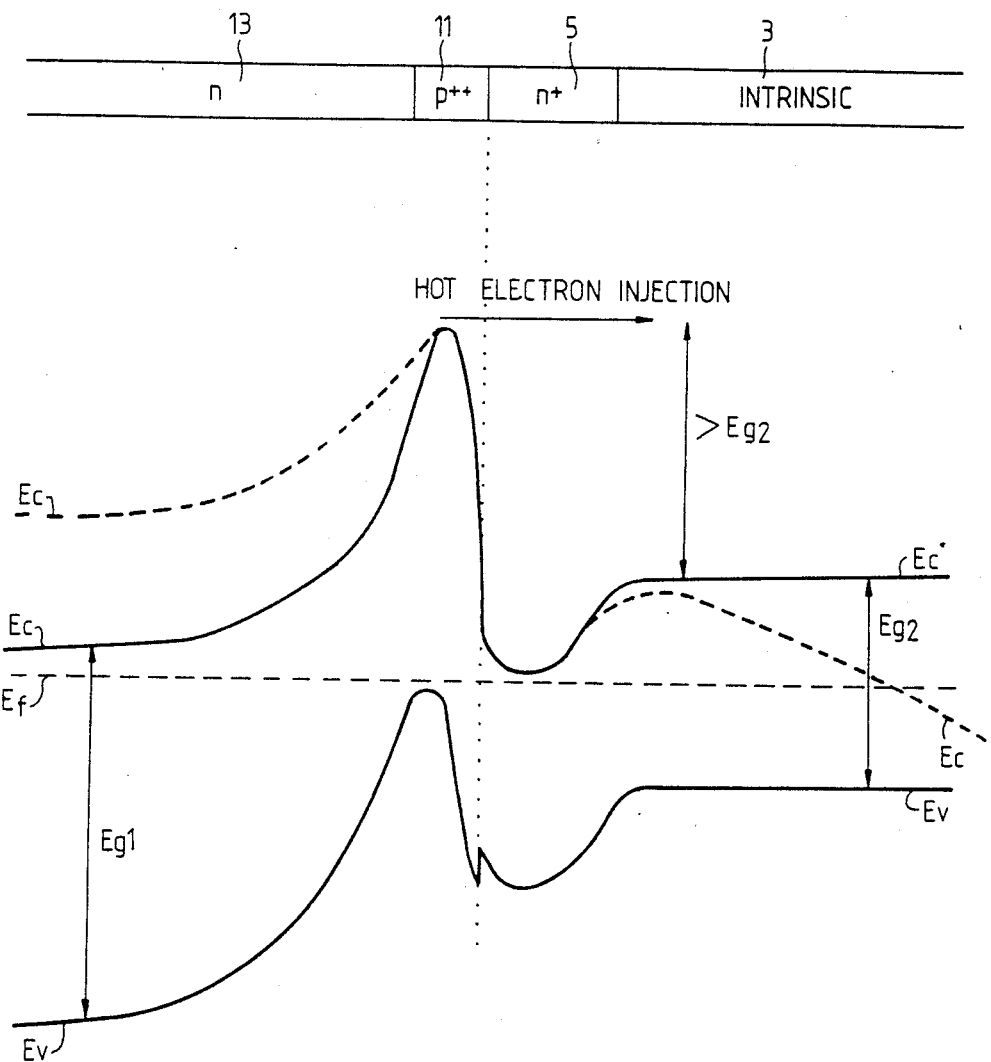

SEMICONDUCTOR DEVICES

This invention relates to semiconductor devices.

In recent years various semiconductor devices have been proposed which make use of so-called hot electron emitters to provide fast, semi-ballistic, current carriers and so obtain a device capable of high speed operation.

It is an object of the present invention to provide a semiconductor device which utilises hot electrons in a novel manner to obtain a high speed switching operation.

Accordingly the present invention provides a semiconductor switching device comprising: a body of substantially intrinsic semiconductor material carried on a substrate of n-type conductivity; a hot electron emitter arranged to inject hot electrons into said body, when a bias potential is applied between said emitter and said substrate, with an energy sufficient to generate electron-hole pairs in said body by collision of injected electrons with valence electrons; and a region of p-type conductivity semiconductor material contiguous with said body to which, when appropriately biassed with respect to said substrate, generated holes will diffuse.

Said hot electron emitter suitably comprises a region of an n-type conductivity semiconductor material having a relatively wide energy bandgap between conduction and valence bands compared with the material of said body, which n-type region is separated from said body by a layer of p-type conductivity semiconductor material.

Preferably between said body and said hot electron emitter there is provided a layer of n-type conductivity semiconductor material having substantially the same energy band gap as the material of said body.

In one particular embodiment of the invention said body, said region of p-type conductivity material contiguous therewith and, if present, said layer of n-type conductivity material consist of gallium arsenide based material and said hot electron emitter consists of aluminium-gallium arsenide based material.

One semiconductor switching device in accordance with the invention will now be described by way of example with reference to the accompanying drawings in which:

FIG. 3 is a diagram illustrating the variation of the energy bandgap across a part of the device.

Figure 1:
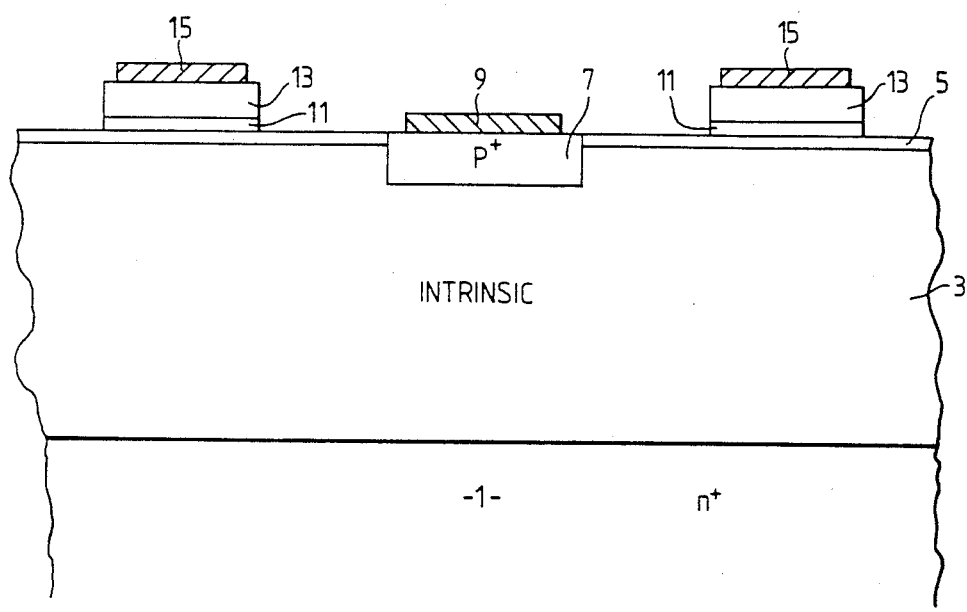
FIG. 1 is a diagrammatic sectional view of the device.

Referring to FIG. 1, the device is formed on a substrate 1 of gallium arsenide having an n-type doping level. On one of its main faces the substrate carries a layer 3 of undoped, i.e. semi-insulating, gallium arsenide, and on its face remote from the substrate the layer 3 carries a thin layer 5 of n-type gallium arsenide.

At a central position in the layers 3 and 5 there is formed a p-type region 7 of gallium arsenide, the region 7 being provided with a metallised layer contact 9.

Coaxially surrounding the region 7 and its contact 9 and spaced therefrom there is an annular hot electron emitter comprising a thin heavily doped p-type layer 11 of aluminium-gallium arsenide adjacent the layer 5 overlayed by a relatively thick n-type aluminium-gallium arsenide layer 13. The hot emitter is provided with a metallised layer contact 15 on the layer 13.

In operation of the device the region 7 is biassed negatively with respect to the substrate 1 via the contact 9, and the potential of the contact 15 is arranged to be switchable between the substrate potential and a potential negative with respect to the substrate potential, as further described below.

Figure 2:
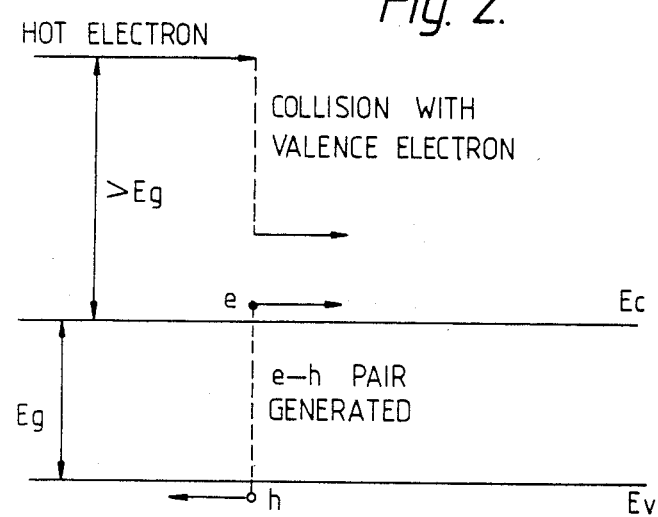
FIG. 2 is a diagram illustrating the operation of the device.

Referring now to FIG. 2, if the contact 15 is biassed sufficiently negatively, electrons having an energy above the conduction band edge Ec of the material of the layer 3 by an amount greater than the energy band gag Eg of the material of the layer 3 will be injected by the hot emitter into the layer 3.

Such electrons will have sufficient energy to create electron-hole pairs in the layer 3 by collision with valence electrons. The life time of the generated carriers is arranged to be sufficiently long for generated holes to diffuse to the p-type region 7 and hence the contact 9, and for generated electrons to diffuse to the n-type substrate 1, under the influence of the electric field provided by the bias potential applied between the contact 9 and the substrate.

Thus, a current will flow between the contact 9 and the substrate 1 when the contact 15 is appropriately negatively biassed, the current being turned off when the bias applied to contact 15 is removed.

Referring now to FIG. 3, to obtain injected electrons of sufficient energy, the layer 13 consists of a material having a relatively wide energy band gap Eg1 compared with the energy band gap Eg2 of the material of the layer 3, and the doping of layer 11 is sufficiently high to ensure that electrons passing over the barrier presented by layer 11 will have the required energy, i.e. greater than Eg2 above the conduction band edge Ec in the material of layer 3.

The n-type layer 5 ensures a rapid drop in potential to launch electrons passing over the barrier into the layer 3, and also provides a barrier to prevent generated holes from entering the layer 11.

In FIG. 3, the dotted and full lines referenced Ec indicate the conduction band edge with and without the emitter contact 15 negatively biassed, and dotted line Ef represents the Fermi level without bias applied to contact 15.

The energy band gap Eg2 of the material of layer 3 is chosen to be sufficiently high, e.g. $>1$ eV, to ensure good isolation in the 'off' condition of the device.

It will be understood that the thickness of the n-type layer 5 must be appreciably less than the mean free path of the hot electrons injected from the emitter 11, 13.

It is pointed out that whilst in the particular embodiment of the invention described above by way of example gallium arsenide based materials are used throughout, this is not necessarily the case in a device according to the invention. Thus, in an alternative embodiment of the invention the emitter comprises gallium-phosphide based material and the other semiconductor parts of the device comprise silicon based material.

It will be appreciated that the fabrication of a device in accordance with the invention presents no problem to those skilled in the semiconductor art since it can be fabricated using well known techniques employed for the fabrication of conventional semiconductor devices.

I claim:

1. A semiconductor switching device comprising: a substrate of n-type conductivity; a body of substantially intrinsic semiconductor material carried on said substrate; a hot electron emitter arranged to inject hot electrons into said body, when a bias potential is applied between said emitter and said substrate, with an energy sufficient to generate electron-hole pairs in said body by collision of injected electrons with valence electrons; and a region of p-type conductivity semiconductor material contiguous with said body to which, when appropriately biassed with respect to said substrate, generated holes will diffuse.

2. A device according to claim 1 wherein said hot electron emitter comprises a region of an n-type conductivity semiconductor material having a relatively wide energy bandgap between conduction and valence bands compared with the material of said body, which n-type region is separated from said body by a layer of p-type conductivity semiconductor material.

3. A device according to claim 2 wherein between said body and said hot electron emitter there is provided a layer of n-type conductivity semiconductor material having substantially the same energy band gap as the material of said body.

4. A device according to claim 1 wherein said body and said region of p-type conductivity material contiguous therewith consist of gallium arsenide based material and said hot electron emitter consists of aluminium-gallium arsenide based material.

5. A device according to claim 1 wherein said body and said region of p-type conductivity material contiguous therewith consist of silicon based material and said hot electron emitter consists of gallium phosphide based material.

6. A device according to claim 1 wherein said hot emitter is of annular form and surrounds said region of p-type conductivity material contiguous with said body.

7. A device according to claim 1 wherein said body consists of a material having an energy band gap greater than one electron-volt.

* * * * *